(12) United States Patent
Choi

(10) Patent No.: US 11,581,384 B2
(45) Date of Patent: Feb. 14, 2023

(54) DISPLAY DEVICE INCLUDING AN EMISSION LAYER

(71) Applicant: SAMSUNG DISPLAY CO., LTD., Yongin-si (KR)

(72) Inventor: Jun Won Choi, Cheonan-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 117 days.

(21) Appl. No.: 17/098,399

(22) Filed: Nov. 15, 2020

(65) Prior Publication Data
US 2021/0143242 A1 May 13, 2021

Related U.S. Application Data

(62) Division of application No. 15/805,694, filed on Nov. 7, 2017, now Pat. No. 10,872,945.

(30) Foreign Application Priority Data

Jan. 26, 2017 (KR) .................. 10-2017-0012531

(51) Int. Cl.
*H01L 27/32* (2006.01)
*H01L 51/52* (2006.01)
(Continued)

(52) U.S. Cl.
CPC ....... *H01L 27/3272* (2013.01); *G09G 3/3233* (2013.01); *H01L 27/3262* (2013.01);
(Continued)

(58) Field of Classification Search
CPC combination set(s) only.
See application file for complete search history.

(56) References Cited

U.S. PATENT DOCUMENTS

2014/0098078 A1 4/2014 Jeon et al.
2014/0104532 A1 4/2014 Cho et al.
(Continued)

FOREIGN PATENT DOCUMENTS

KR 100476620 3/2005
KR 1020160128546 11/2018

OTHER PUBLICATIONS

Extended European Search Report dated May 24. 2018 For European Patent Application No. 17205052.8.
(Continued)

*Primary Examiner* — Moin M Rahman
(74) *Attorney, Agent, or Firm* — F. Chau & Associates, LLC

(57) ABSTRACT

A display device includes pixels, scan lines, and data lines. A first driving gate electrode is disposed at a first pixel of the display device. A second driving gate electrode is disposed at a second pixel of the display device. A first driving voltage line includes a first extending part that overlaps a first driving gate electrode. A second driving voltage line includes a second extending part that overlaps a second driving gate electrode. A first pixel electrode of the first pixel overlaps the second driving gate electrode. The second extending part includes a first recess portion. A center line of the first recess portion is offset in a direction away from the first pixel electrode with respect to a center line of the second driving gate electrode.

18 Claims, 10 Drawing Sheets

(51) Int. Cl.
*G09G 3/3233* (2016.01)
*H01L 27/12* (2006.01)
(52) U.S. Cl.
CPC ...... *H01L 27/3265* (2013.01); *H01L 27/3276* (2013.01); *H01L 51/5206* (2013.01); *G09G 2300/0819* (2013.01); *G09G 2300/0842* (2013.01); *G09G 2300/0861* (2013.01); *G09G 2320/0214* (2013.01); *G09G 2320/0238* (2013.01); *H01L 27/1214* (2013.01); *H01L 27/3216* (2013.01)

(56) References Cited

U.S. PATENT DOCUMENTS

| | | | |
|---|---|---|---|
| 2015/0102299 A1* | 4/2015 | Hong | H01L 27/3258 257/40 |
| 2015/0130691 A1 | 5/2015 | Jeon | |
| 2016/0247452 A1 | 8/2016 | Lee et al. | |
| 2016/0322448 A1 | 11/2016 | Kim | |
| 2018/0212014 A1 | 7/2018 | Choi | |

OTHER PUBLICATIONS

Extended European Search Report dated Aug. 28, 2018 For European Patent Application No. 17205052.8.

* cited by examiner

DISPLAY DEVICE INCLUDING AN EMISSION LAYER

CROSS-REFERENCE TO RELATED APPLICATION

This application is a Division of co-pending U.S. patent application Ser. No. 15/805,694, filed on Nov. 7, 2017, which claims priority to and the benefit of Korean Patent Application No. 10-2017-0012531 filed in the Korean Intellectual Property Office on Jan. 26, 2017, the entire contents of which are herein incorporated by reference.

TECHNICAL FIELD

The present disclosure relates to a display device, and more particularly, to a display device including an emission layer.

DISCUSSION OF THE RELATED ART

A display device includes a plurality of pixels for displaying an image. Each pixel of the display device may include an emission layer. For example, each pixel may include a light emitting diode (LED) having a cathode, an anode, and an emission layer disposed therebetween. A plurality of transistors and at least one capacitor may further be included within each pixel to drive the light emitting, diode (LED).

Within each LED, an electron injected from the cathode and a hole injected from the anode are coupled with each other within the light emitting layer to form an exciton, and the exciton emits light while relaxing.

The plurality of transistors may include at least one switching transistor and at least one driving transistor. The switching transistor receives a data signal that is set according to a scan signal, thereby transmitting a voltage that depends on the data signal to the driving transistor. The driving transistor is directly or indirectly connected to the light emitting diode (LED) to control an amount of a driving current that is transmitted to the light emitting diode (LED). Thereby, each pixel may emit light of a desired luminance.

The capacitor of each pixel is connected to a driving gate electrode of the driving transistor, thereby serving a function of maintaining a voltage of the driving gate electrode.

However, if the voltage of the driving gate electrode is not properly maintained, crosstalk may occur and the quality of the display device may be reduced.

SUMMARY

A display device includes a plurality of pixels including a first pixel and a second pixel. A plurality of scan lines extends in a first direction. A plurality of data lines cross the plurality of scan lines. The plurality of data lines transmits a data signal. A plurality of driving voltage lines crosses the plurality of scan line. The plurality of driving voltage lines transmits a driving voltage. A first driving gate electrode is disposed at the first pixel. A second driving gate electrode is disposed at the second pixel. A first driving voltage line among the plurality of driving voltage lines includes a first extending part that overlaps the first driving gate electrode. A second driving voltage line among the plurality of driving voltage lines includes a second extending part that overlaps the second driving gate electrode. A first pixel electrode of the first pixel overlaps the second driving gate electrode. The second extending part includes a first recess portion. A center line of the first recess portion is offset in a direction away from the first pixel electrode with respect to a center line of the second driving gate electrode.

A display device includes a plurality of data lines, a plurality of driving voltage lines, a first pixel, and a second pixel. Each of the first and second pixels includes a light emitting diode, a sixth transistor connected to the light emitting diode, a first transistor connected to the sixth transistor, the first transistor including a driving gate electrode, and an extending part extending from the driving voltage line and overlapping the driving gate electrode to form a capacitor. The extending part of the first pixel has an asymmetric shape with respect to a line extending in the first direction. The extending part of the second pixel has a shape that is symmetrical with respect to the extending part of the first pixel about a line extending in the first direction.

A display device includes a pixel and a driving voltage line for driving the pixel. The driving voltage line for driving the first pixel includes an extending part having a first recessed portion on a first edge of the extending part and a second recessed portion of a second edge of the extending part. The first recessed portion of the extending part is offset from the center of the extending part.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
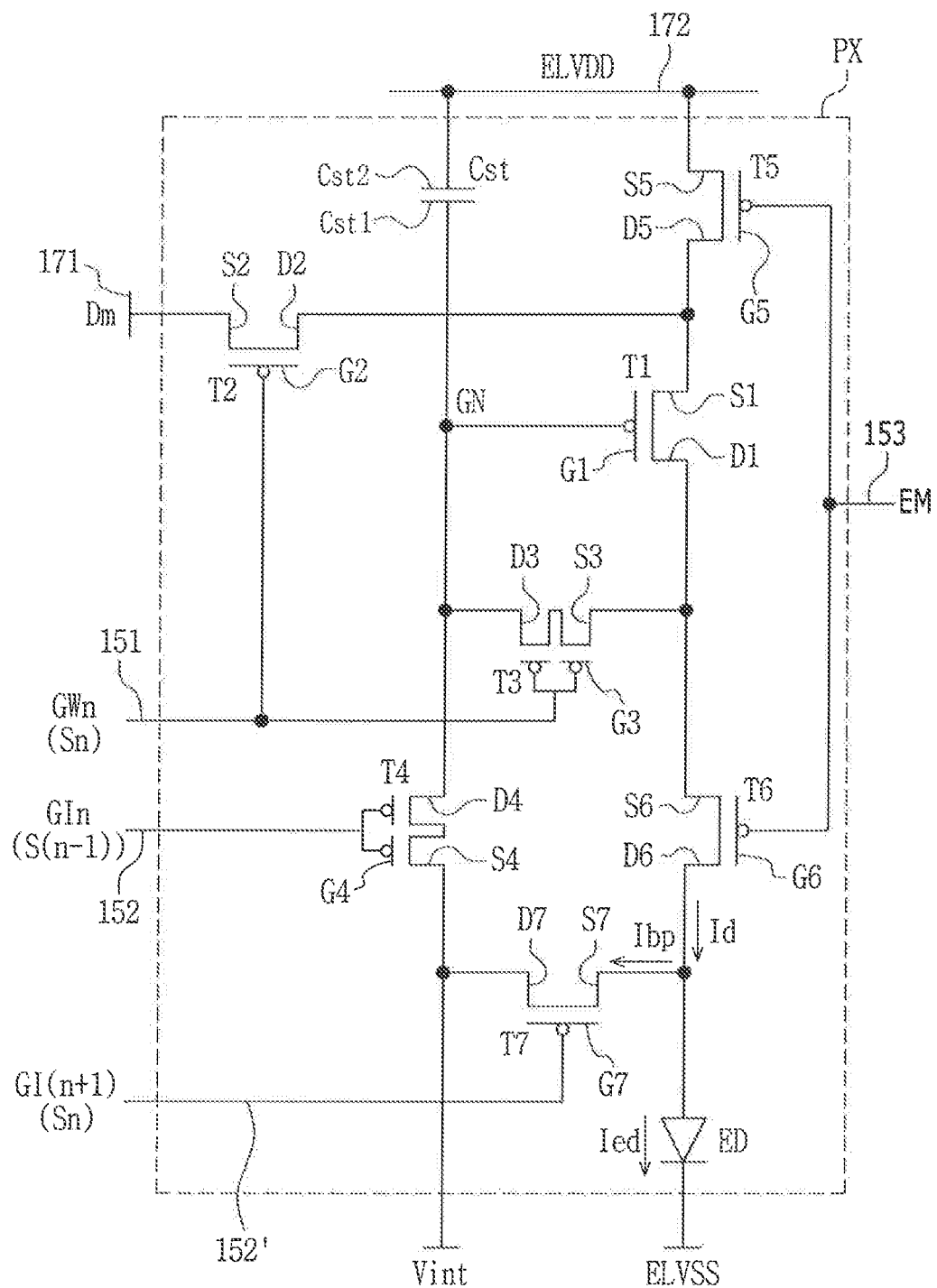
FIG. 1 is a circuit diagram illustrating one pixel of a display device according to an exemplary embodiment of the present invention.

The present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

Accordingly, the drawings and description are to be regarded as illustrative in nature. Like reference numerals may designate like elements throughout the specification and figures.

In addition, the size and thickness of the layers, films, panels, regions, etc. shown in the drawings may be exaggerated for clarity.

It will be understood that when an element such as a layer, film, region, or substrate is referred to as being "on" another element, it can be directly on the other element or intervening elements may also be present. A display device according to an exemplary embodiment of the present invention will be described below with reference to accompanying drawings.

FIG. 1 is a circuit diagram illustrating one pixel of a display device according to an exemplary embodiment of the present invention.

Referring to FIG. 1, the display device, according to an exemplary embodiment of the present invention, includes a plurality of pixels PX that together displays an image, and a plurality of signal lines 151, 152, 152', 153, 171, and 172. Each pixel PX may include a plurality of transistors T1, T2, T3, T4, T5, T6, and T7, a capacitor Cst, and at least one light emitting diode (LED) ED that are connected to the plurality of signal lines 151, 152, 152', 153, 171, and 172. According to one exemplary embodiment of the present invention, each pixel PX may include a single light emitting diode (LED) ED, as shown. However, it is to be understood that there may be, two, three, four, or any other number of LEDs disposed within each pixel.

Of the signal lines 151, 152, 152', 153, 171, and 172, there may be a plurality of scan lines 151, 152, and 152', a plurality of control lines 153, a plurality of data lines 171, and a plurality of driving voltage lines 172.

The plurality of scan lines 151, 152, and 152' may respectively transmit scan signals GWn, GIn, and GI(n+1). The scan signals GWn, GIn, and GI(n+1) may transmit a gate-on voltage and a gate-off voltage capable of turning-on/turning-off the transistors T2, T3, T4, and T7 included in the pixel PX.

The scan lines 151, 152, and 152' connected to one pixel PX may include a first scan line 151 transmitting the scan signal GWn, a second scan line 152 transmitting the scan signal GIn having the gate-on voltage at a different time from that of the first scan line 151, and a third scan line 152' transmitting the scan signal GI(n+1). According to one exemplary embodiment of the present invention, the second scan line 152 transmits the gate-on voltage at an earlier time from that of the first scan line 151 (as shown). However, it is to be understood that the invention is not necessarily limited to this arrangement. For example, when the scan signal GWn is an n-th scan signal Sn among scan signals applied during one frame (where n is a positive integer), the scan signal Gin may be a previous scan signal such as an (n−1)-th scan signal S(n−1), and the scan signal GI(n+1) may be an n-th scan signal Sn. However, the invention is not limited to this approach, and the scan signal GI(n+1) may be a different scan signal from the n-th scan signal Sn.

The control line 153 may transmit a control signal, and for example, may transmit an emission control signal controlling the emission of the light emitting diode (LED) ED included in the pixel PX. The control signal transmitted by the control line 153 may transmit the gate-on voltage and the gate-off voltage, and may transmit a different waveform from that of the scan signal transmitted by the scan lines 151, 152, and 152'.

The data line 171 may transmit the data signal Dm, and the driving voltage line 172 may transmit the driving voltage ELVDD. The data signal Dm may have other voltage levels that are set according to the image signal input to the display device, and the driving voltage ELVDD may have a substantially constant voltage level.

The display device may further include a driver transmitting a signal to the plurality of signal lines 151, 152, 152', 153, 171, and 172. For example, the driver may include a scan driver transmitting the scan signal to the plurality of scan lines 151, 152, and 152', and a data driver transmitting the data signal to the data line 171. The driver may be directly formed on the display panel of the display device along with the plurality of transistors T1-T7 included in the pixel PX, or the driver may be attached to the display panel as part of a driving circuit chip. Alternatively, the driver may be disposed on a printed circuit film connected to the display panel to transmit the driving signal to the display panel. The driver or the printed circuit film may be disposed in a peripheral region of the display area in which the plurality of pixels PX are disposed.

The plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3 The second scan line 152 may transmit the scan signal GIn to the fourth transistor T4. The third scan line 152' may transmit the scan signal GI(n+1) to the seventh transistor T7. The control line 153 may transmit the control signal EM to the fifth transistor T5 and the sixth transistor T6.

A gate electrode G1 of the first transistor T1 is connected to one terminal Cst1 of the capacitor Cst through a driving gate node GN. A source electrode S1 of the first transistor T1 is connected to the driving voltage line 172 via the fifth transistor T5. A drain electrode D1 of the first transistor T1 is connected to an anode of the light emitting diode (LED) ED via the sixth transistor T6. The first transistor T1 receives a data signal Dm transmitted by the data line 171 in accordance with a switching operation of the second transistor T2 to supply a driving current Id to the organic light emitting diode (LED) ED.

A gate electrode G2 of the second transistor T2 is connected to the first scan line 151. A source electrode S2 of the second transistor T2 is connected to the data line 171. A drain electrode D2 of the second transistor T2 is connected to the driving voltage line 172 via the fifth transistor T5 and is also connected to the source electrode S1 of the first transistor T1. The second transistor T2 is turned on in accordance with the scan signal GWn transmitted through the first scan line 151 such that the data signal Dm transmitted from the data line 171 may be transmitted to the source electrode S1 of the first transistor T1.

A gate electrode G3 of the third transistor T3 is connected to the first scan line 151. A source electrode S3 of the third transistor T3 is connected to the anode of the light emitting diode (LED) ED via the sixth transistor T6 and is also connected to the drain electrode D1 of the first transistor T1. A drain electrode D3 of the third transistor T3 is connected to a drain electrode D4 of the fourth transistor T4, to one terminal Cst1 of the capacitor Cst, and to the gate electrode G1 of the first transistor T1. The third transistor T3 is turned on in accordance with the scan signal GWn transmitted through the first scan line 151 to diode-connect the first transistor T1 by connecting the gate electrode G1 and the drain electrode D1 of the first transistor T1 to each other.

A gate electrode G4 of the fourth transistor T4 is connected to the second scan line 152. A source electrode S4 of the fourth transistor T4 is connected to a terminal of an initialization voltage Vint. A drain electrode D4 of the fourth transistor T4 is connected to one terminal Cst1 of the capacitor Cst and the gate electrode G1 of the first transistor T1 through the drain electrode D3 of the third transistor T3. The fourth transistor T4 is turned on in accordance with the scan signal GIn transmitted through the second scan line 152 to transmit the initialization voltage Vint to the gate electrode G1 of the first transistor T1, thereby performing an initialization operation of initializing the voltage of the gate electrode G1 of the first transistor T1.

A gate electrode G5 of the fifth transistor T5 is connected to the control line 153. A source electrode S5 of the fifth transistor T5 is connected to the driving voltage line 172. A drain electrode D5 of the fifth transistor T5 is connected to the source electrode S1 of the first transistor T1 and the drain electrode D2 of the second transistor T2.

A gate electrode G6 of the sixth transistor T6 is connected to the control line 153. A source electrode S6 of the sixth transistor T6 is connected to both the drain electrode D1 of the first transistor T1 and the source electrode S3 of the third transistor T3. A drain electrode 136 of the sixth transistor T6 is electrically connected to the anode of the light emitting diode (LED) ED. The fifth transistor T5 and the sixth transistor T6 are simultaneously turned on in accordance with the emission control signal EM transmitted through the control line 153, and thereby the driving voltage ELVDD is compensated through the diode-connected first transistor T1 to be transmitted to the light emitting diode LED) ED.

A gate electrode G7 of the seventh transistor T7 is connected to the third scan line 152'. A source electrode S7 of the seventh transistor T7 is connected to both the drain electrode D6 of the sixth transistor T6 and the anode of the light emitting diode (LED) ED. A drain electrode D7 of the seventh transistor 17 is connected to both the terminal of the initialization voltage Vint and the source electrode S4 of the fourth transistor T4.

The transistors T1, T2, T3, T4, T5, T6, and T7 may be P-type channel transistors such as a PMOS, however the present invention is not limited thereto. At least one among the transistors T1, T2, T3, T4, T5, T6, and T7 may be an N-type channel transistor.

One terminal Cst1 of the capacitor Cst is connected to the gate electrode G1 of the first transistor T1 as described above. The other terminal Cst2 of the capacitor Cst is connected to the driving voltage line 172. A cat lode of the light emitting diode (LED) ED is connected to the terminal of the common voltage ELVSS so as to transmit the common voltage ELVSS.

The structure of the pixel PX, according to an exemplary embodiment of the present invention, may be arranged in alternative configurations to the structure shown in FIG. 1. For example, the number of transistors and the number of capacitors that are included in each pixel PX and the manner in which these elements are interconnected may be variously modified, within the scope of the present invention.

Figure 2:
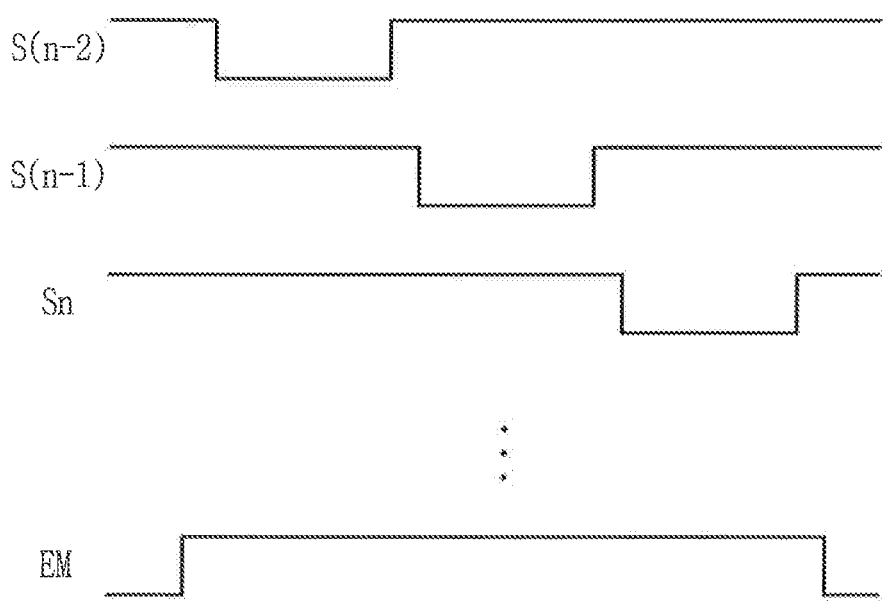
FIG. 2 is a timing diagram illustrating signals applied to a pixel of a display device according to an exemplary embodiment of the present invention.

Next, an operation of the display device according to an exemplary embodiment of the present invention will be described with reference to FIG. 2 as well as FIG. 1. FIG. 2 is a timing diagram illustrating a signal applied to a pixel of a display device according to an exemplary embodiment of the present invention. In the present description, an example in which the transistors T1, T2, T3, T4, T5, T6, and T7 are P-type channel transistors is described, and the operation of one frame is described.

Referring to FIG. 2, in one frame, the scan signals S(n-2), S(n-1), Sn, . . . , of a low level may be sequentially applied to the plurality of first scan lines 151 connected to the plurality of pixels PX.

The scan signal Gin of the low level is supplied through the second scan line 152 during a2n initialization period. For example, the scan signal Gin may be an (n-1)-th scan signal S(n-1), Thus, the fourth transistor T4 is turned on in accordance with the scan signal GIn of the low level, the initialization voltage Vim is transmitted to the gate electrode G1 of the first transistor T1 through the fourth transistor T4, and the first transistor T1 is initialized by the initialization voltage Vint.

Subsequently, if the scan signal GWn of the low level is supplied through the first scan line 151 during a data programming and compensation period, the second transistor T2 and the third transistor T3 are turned on in response to the scan signal GWn of the low level. For example, the scan signal GWn may be the n-th scan signal Sn. In this case, the first transistor T1 is diode-connected by the turned-on third transistor T3 and is biased in a forward direction. Accordingly, a compensation voltage (Dm+Vth, where Vth is a negative value) that is decreased by a threshold voltage Vth of the first transistor T1 from the data signal Dm supplied from the data line 171 is applied to the gate electrode G1 of the first transistor T1. For example, the gate voltage applied to the gate electrode G1 of the first transistor T1 becomes the compensation voltage (Dm+Vth).

The driving voltage ELVDD and the compensation voltage (Dm+Vth) are respectively applied to both terminals of the capacitor Cst, and the capacitor Cst is charged with a charge corresponding to a voltage difference of both terminals.

Next, the light emitting control signal EM supplied from the control line 153 is changed from the high level to the low level during a light emitting period. The time at which the emission control signal EM is changed from the high level to the low level may be after the scan signal GWn is applied to all first scan lines 151 in one frame. Thus, during the light emitting period, the fifth transistor T5 and the sixth transistor T6 are turned on by the light emitting control signal EM of the low level. Thus, a driving current Id is generated in accordance with the voltage difference between the gate voltage of the gate electrode G1 of the first transistor T1 and the driving voltage ELVDD, and the driving current Id is supplied to the light emitting diode (LED) ED through the sixth transistor T6. Accordingly, a current Ied flows to the light emitting diode (LED) ED. The gate-source voltage Vgs of the first transistor T1 is maintained as "(Dm+Vth)-ELVDD" by the capacitor Cst during the light emitting period, and, according to a current-voltage relationship of the first transistor T1, the driving current Id may be proportional to a square of a value obtained by subtracting the threshold voltage from the driving gate-source voltage $(Dm-ELVDD)^2$. Accordingly, the driving current Id may be determined regardless of the threshold voltage Vth of the first transistor T1.

During an initialization period, the seventh transistor T7 receives the scan signal GI(n+1) of the low level through the third scan line 152' to be turned on. The scan signal GI(n+1) may be the n-th scan signal Sn. A part of the driving current 1d flows out through the turned-on seventh transistor T7 as a bypass current Ibp.

Next, the detailed structure of the display device, according to an exemplary embodiment of the present invention, will be described with reference to FIG. 3 to FIG. 8 along with FIG. 1 and FIG. 2.

A planar structure of the display device, according to an exemplary embodiment of the present invention, will be first described with reference to FIG. 3 to FIG. 5, and then a cross-sectional structure of the display device will be described with reference to FIG. 6 to FIG. 8.

Figure 3:
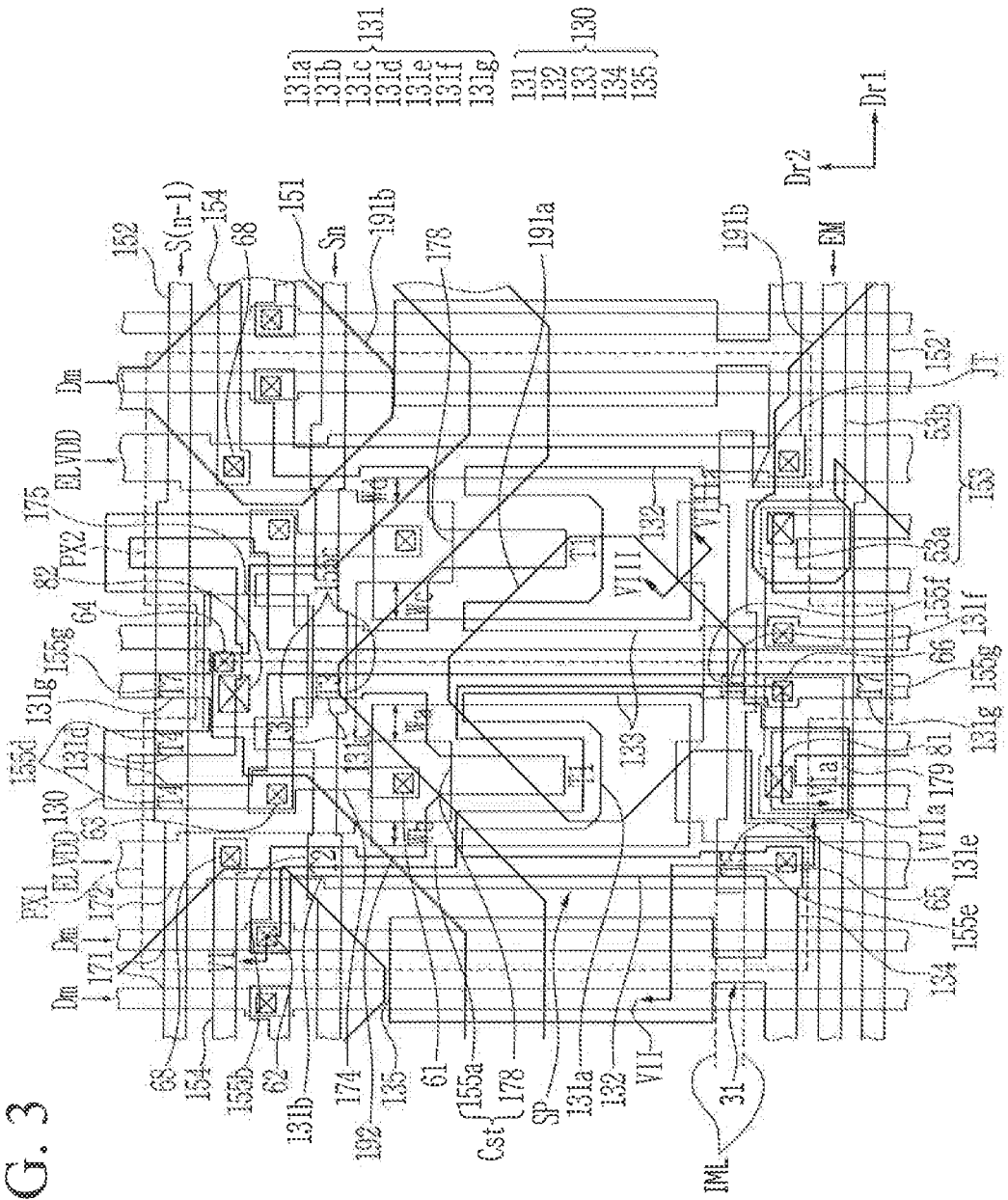
FIG. 3 is a layout view illustrating two adjacent pixels of a display device according to an exemplary embodiment of the present invention.

Retelling to FIG. 3, one pixel of the display device, according to an exemplary embodiment of the present invention, may include a plurality of transistors T1, T2, T3, T4, T5, T6, and T7 and a capacitor Cst that are connected to a plurality of scan lines 151, 152, and 152', a control line 153, a data line 171, and a driving voltage line 172. As is described in detail below, the plurality of scan lines 151, 152, and 152' and the control line 153 are included in a first conductive layer such that they may be disposed at the same layer, as may be seen in the cross-sectional view, and may include the same material. The data line 171 and the driving voltage line 172 are included in a second conductive layer that is different from the first conductive layer such that they may be disposed at the same layer and may include the same material.

Two pixels PX1 and PX2 adjacent to each other in the first direction Dr1 (referred to as a horizontal direction or a left/right direction) may have an axisymmetric structure with respect to a longitudinal boundary therebetween. However, the pixels are not limited to this particular configuration. The data line 171 and the driving voltage line 172 may also be disposed with the axisymmetric structure with respect to the longitudinal boundary between two adjacent pixels PX1 and PX2.

The data line 171 and the driving voltage line 172 may extend substantially in the second direction Dr2 (referred to as a vertical direction or an up/down direction) as may be seen in a plan view. The second direction Dr2 is a direction perpendicular to the first direction Dr1.

The driving voltage line 172 includes a plurality of extending parts 178 extending in the first direction Dr1. The extending parts 178 extend in a direction opposite to the direction that the data line 171, directly adjacent to the driving voltage line 172, are extended in. One extending part 178 may be disposed in the region of each pixel PX1 or PX2. Two extension parts 178 disposed at two pixels PX1 and PX2 adjacent to each other in the first direction Dr1, without two data lines 171, may be connected to each other. Accordingly, the driving voltage ELVDD transmitted by the driving voltage line 172 for two adjacent pixels PX1 and PX2 may also be transmitted in the first direction Dr1 through the extension parts 178 connected to each other. The detailed structure of the extending part 178 is described below.

Adjacent driving voltage lines 172 may be connected to each other through a connecting member 154. The connecting member 154 may extended substantially in the first direction Dr1. The driving voltage line 172 is connected to the connecting member 154 through a contact hole 68. Accordingly, the driving voltage ELVDD is transmitted along the driving voltage line 172 in the second direction Dr2 and is transmitted through the connecting member 154 in the first direction Dr1. The driving voltage ELVDD is thereby transmitted along a mesh shape over the entire display area of the display device. The connecting member 154 may be included in the first conductive layer, as may be seen in the cross-sectional view.

Referring to FIG. 3, the plurality of scan lines 151, 152, and 152' and the control line 153 may respectively and substantially extend in the first direction Dr1, thereby crossing the data line 171 and the driving voltage line 172. The first scan line 151 may be disposed between the second scan line 152 and the control line 153, as may be seen in the plan view. The third, scan line 152' may transmit the scan signal GI(n+1) after the scan signal GIn is transmitted by the second scan line 152. For example, as described above, when the first scan line 151 transmits the n-th scan signal Sn, the third scan line 152' may also transmit the n-th scan signal Sn.

The control line 153 may have, as shown in FIG. 3, a shape that is regularly changed with a predetermined cycle (or a pitch), and the predetermined pitch may be the same as a width of the n pixels PX (where n is a positive integer) in the first direction Dr1. FIG. 3 shows an example in which the control line 153 has the regular shape with the width of two pixels PX1 and PX2 as the pitch in the first direction Dr1. The detailed shape of the control line 153 is described below.

Each channel of the plurality of transistors T1, T2, T3, T4, T5, T6, and T7 may be formed in one active pattern 130, and the active pattern 130 may be bent in various shapes. The active pattern 130 may be made of a semiconductor material such as amorphous/polysilicon or an oxide semiconductor.

The active pattern 130 includes a channel region 131 of a semiconductor and a conductive region. The channel region 131 includes channel regions 131a, 131b, 131c, 131d, 131e, 131f, and 131g forming each channel of the transistors T1, T2, T3, T4, T5, T6, and T7. In the active pattern 130, the part except for the channel regions 131a, 131b, 131c, 131d, 131e, 131f, and 131g may be the conductive region. The conductive region has a higher carrier concentration than that of the channel regions 131a, 131b, 131c, 131d, 131e, 131f, and 131g. The conductive region is disposed at both sides of each of the channel regions 131a, 131b, 131c, 131d, 131e, 131f, and 131g, and may include a source region and a drain region of the corresponding transistors T1, T2, T3, T4, T5, T6, and T7.

Referring to FIG. 3, the active pattern 130 of one pixel PX1 or PX2 may include a first longitudinal part 132 and a second longitudinal part 133 facing each other via the channel region 131a of the first transistor T1 disposed at a center therebetween. The first longitudinal part 132 and the second longitudinal part 133 may respectively extend in substantially the second direction Dr2.

The first transistor T1 includes the channel region 131a, the source region and the drain region as the conductive regions of the active pattern 130 disposed at respective sides of the channel region 131a. The first transistor T1 further includes a driving gate electrode 155a overlaps the channel region 131a. The channel region 131a may be curved at least one time. For example, the channel region 131a of the first transistor T1 may have a waving shape, a meandering shape, or a zigzag shape. FIG. 3 shows an example in which the channel region 131a forms an approximate "U" shape. The channel region 131a is connected to the first longitudinal pan 132 and the second longitudinal part 133 of the active pattern 130, the conductive region of the first longitudinal part 132 corresponds to the source region of the first transistor T1, and the second longitudinal part 133 corresponds to the drain region of the first transistor T1.

The driving gate electrode 155a may be disposed between the first longitudinal part 132 and the second longitudinal part 133 of the active pattern 130. The driving gate electrode 155a may be included in the first conductive layer and may be connected to a connecting member 174 through a contact hole 61. The connecting member 174 may be included in the second conductive layer, as may be seen in the cross-sectional view. A planar shape of the driving gate electrode 155a may be an approximate rectangle, but is not limited thereto.

The driving gate electrode 155a and the channel region 131a of the first transistor T1 may be disposed between the first scan line 151 and the control line 153.

The second transistor T2 includes the channel region 131b, the source region, and the drain region as the conductive region of the active pattern 130 disposed at respective sides of the channel region 131b. The second transistor T2 further includes a gate electrode 155b of the channel region 131b. The pan overlapping the channel region 131b among the first scan line 151 may form the gate electrode 155b. The conductive region of the active pattern 130 is connected to the channel region 131b and is arranged above the first scan line 151. The source region of the second transistor T2 is connected to the data line 171 through a contact hole 62. The channel region 131b is connected to the first longitudinal part 132 of the active pattern 130. The part of the first longitudinal part 132 disposed under the channel region 131b corresponds to the drain region of the second transistor T2.

The third transistor T3 includes the channel region 131c, the source region and the drain region as the conductive region of the active pattern 130 disposed at respective sides of the channel region 131c. The third transistor T3 further includes a gate electrode 155c overlapping the channel region 131c. The part overlapping the channel region 131c among the first scan line 151, may form the gate electrode 155c. The gate electrode 155c may be formed of two parts to prevent a leakage current. The conductive region of the active pattern 130 is arranged above the first scan line 151 and is connected to the channel region 131c. The drain region of the third transistor T3 is connected to the connecting member 174 though a contact hole 63. The channel region 131c is connected to the second longitudinal part 133 of the active pattern 130. The part of the second longitudinal part 133 disposed under the channel region 131c corresponds to the source region of the third transistor T3.

The fourth transistor T4 includes the channel region 131d, the source region and the drain region as the conductive region of the active pattern 130 disposed at respective sides of the channel region 131d. The fourth transistor T4 further includes a gate electrode 155d overlapping the channel region 131d. The part overlapping the channel region 131d, among the second scan line 152, may form the gate electrode 155d. The gate electrode 155d may be formed of two parts to prevent the leakage current. The conductive region of the active pattern 130 that is arranged below the second scan line 152 and is not connected to the third transistor T3 as the source region of the fourth transistor T4 is connected to a connecting member 175 through a contact hole 64. The connecting member 175 may be included in the second conductive layer, as may be seen in the cross-sectional view.

The fifth transistor T5 includes the channel region 131e, the source region, and the drain region as the conductive region of the active pattern 130 disposed at respective sides of the channel region 131e. The fifth transistor T5 further includes a gate electrode 155e overlapping the channel region 131e. The part overlapping the channel region 131e among the control line 153 may form the gate electrode 155e. The conductive region of the active pattern 130 is arranged downward with respect to the control line 153 as the source region of the fifth transistor T5 is connected to the driving voltage line 172 through a contact hole 65. The channel region 131e is connected to the first longitudinal part 132 of the active pattern 130, and the part of the first longitudinal part 132 disposed on the channel region 131e corresponds to the drain region of the filth transistor T5.

The sixth transistor T6 includes the channel region 131f, the source region and the drain region as the conductive region of the active pattern 130 disposed at respective sides of the channel region 131f. The sixth transistor T6 further includes a gate electrode 155f overlapping the channel region 131f. The part of the channel region 131f among the control line 153 may form the gate electrode 155f. The conductive region of the active pattern 130 arranged downward with respect to the control line 153 as the drain region of the sixth transistor T6 is connected to a connecting member 179 through a contact hole 66. The connecting member 179 may be included in the second conductive layer, as may be seen in the cross-sectional view. The channel region 131f is connected to the second longitudinal part 133 of the active pattern 130. This part of the second longitudinal part 133 is disposed on the channel region 131f and corresponds to the source region of the sixth transistor T6.

The seventh transistor T7 includes the channel region 131g, the source region and the drain region as the conductive region of the active pattern 130 disposed at respective sides of the channel region 131g. The seventh transistor T7 further includes a gate electrode 155g overlapping the channel region 131g. The part overlapping the channel region 131g among the second scan line 152 or the third scan line 152' may form the gate electrode 155g. The conductive region of the active pattern 130 arranged downward with respect to the second scan line 152 or the third scan line 152' as the drain region of the seventh transistor T7 is connected to the connecting member 175 through the contact hole 64. The conductive region of the active pattern 130 arranged upward with respect to the second scan line 152 or the third scan line 152' as the source region of the seventh transistor T7 is connected to the drain region of the sixth transistor T6 and is connected to the connecting member 179 through the contact hole 66.

The capacitor Cst may include the driving gate electrode 155a and the extension part 178 of the driving voltage line 172 overlapping each other on the plane as two terminals. The capacitor Cst may maintain the voltage difference corresponding to the difference between the driving voltage ELVDD transmitted through the driving voltage line 172 and the voltage of the driving gate electrode 155a.

Figure 4:
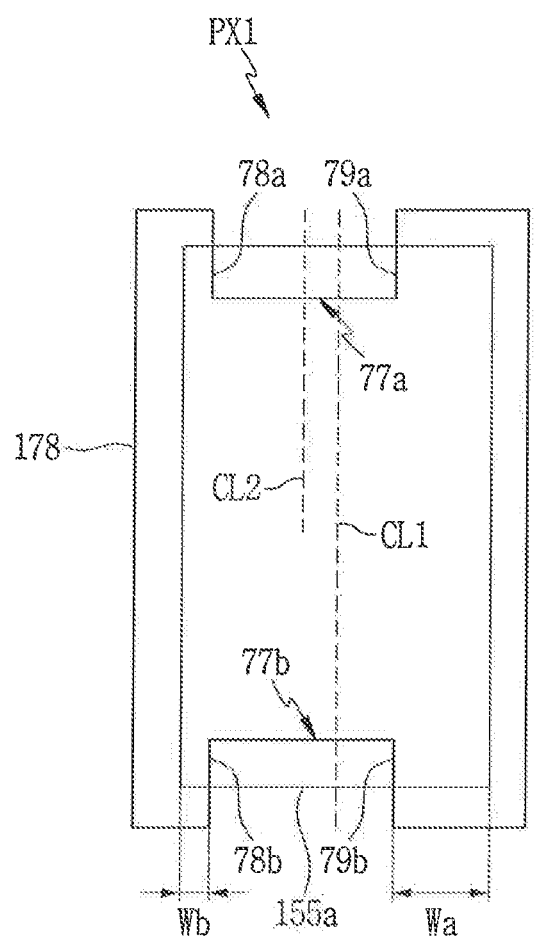
FIG. 4 and FIG. 5 are layout views illustrating two electrodes forming a capacitor of one pixel of a display device according to an exemplary embodiment of the present invention.
Figure 5:
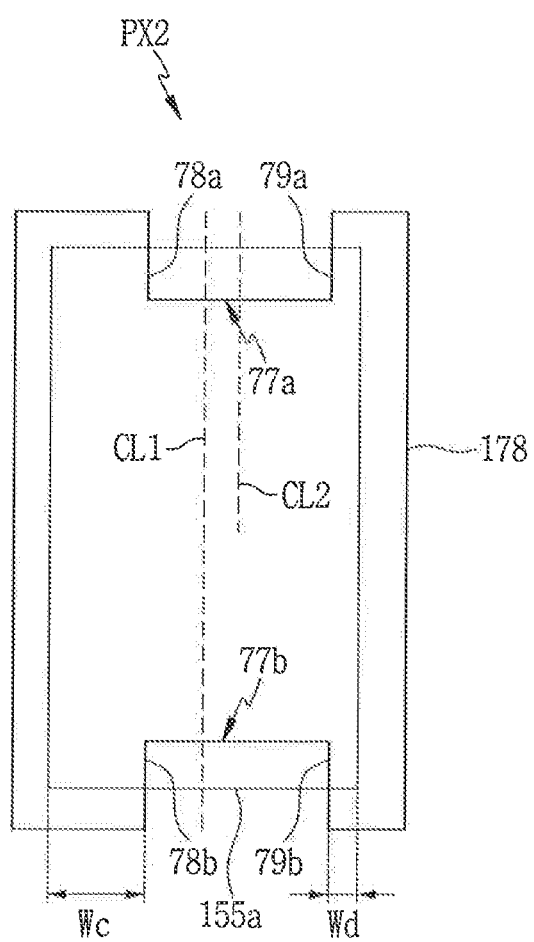

Referring to FIG. 3 to FIG. 5, as may be seen in the plan view, the extending part 178 disposed at one pixel PX1 overlaps the driving gate electrode 155a of the corresponding pixel PX1. The entire shape of the extending part 178 is the approximate rectangle, however the extending part 178 includes an upper recess portion 77a disposed at an upper edge thereof and a lower recess portion 77b disposed at a lower edge if the extending part 178.

The upper recess portion 77a crosses the upper edge of the driving gate electrode 155a, and includes a left side 78a and a right side 79a extending in the second direction Dr2. The lower recess portion 77b crosses the lower edge of the driving gate electrode 155a and includes a left side 78b and a right side 79b extending in the second direction Dr2. The upper recess portion 77a and the lower recess portion 77b may have a vertically symmetrical shape with respect to a transverse center line of the extending part 178, and may be disposed at a position aligned in the vertical direction.

Even if a misalignment is generated in the second direction Dr2 between the driving gate electrode 155a and the extending part 178 during the manufacturing; process of the display device, the upper recess portion 77a and the lower recess portion 77b may maintain the capacitance of the capacitor Cst at a constant level. For example, lengths of the left sides 78a and 78b and the right sides 79a and 79b of the upper recess portion 77a and the lower recess portion 77b may be appropriately controlled.

The extending part 178 has a right left asymmetric shape with respect to a line extending in the second direction Dr2. For example, a longitudinal center line CL1 of the driving gate electrode 155a of one pixel of PX1 and PX2 and a longitudinal center line CL2 of the recess portions 77a and 77b may be inconsistent and misaligned. Referring to FIG. 4, in the pixel PX1, the longitudinal center line CL2 of the recess portions 77a and 77b leftwardly disposed with respect to the longitudinal center line CL1 of the driving gate electrode 155a, and referring to FIG. 5, in the pixel PX2, the longitudinal center line CL2 of the recess portions 77a and 77b is rightwardly disposed with respect to the longitudinal center line CL1 of the driving gate electrode 155a.

The asymmetric shape of the extending part 178 is described in detail below. Referring to FIG. 4, a shortest distance Wa between the right edge of the driving gate electrode 155a and the right side (79a and 79b) of the extending part 178 for one pixel PX1 is not equal to the shortest distance Wb between the left edge of the driving gate electrode 155a and the left side (78a and 78b) of the extending part 178. For example, the shortest distance Wa between the right edge of the driving gate electrode 155a and the right side (79a and 79b) of the extending part 178 for one pixel PX1 may be larger than the shortest distance Wb between the left edge of the driving gate electrode 155a and the left side (78a and 78b) of the extending part 178.

Referring to FIG. 5 as well as FIG. 3 and FIG. 4, the shape of the extending part 178 disposed at the pixel PX2 may be different from that of the extending part 178 of the pixel PX1. For example, the extending pan 178 disposed at the pixel PX2 may have a symmetrical shape with respect to the extending part 178 disposed at the pixel PX1 with respect to a line of the vertical direction. For example, the extending part 178 disposed at the pixel PX2 may have the symmetrical shape with the extending part 178 disposed at the pixel PX1 with respect to the longitudinal boundary line (or the longitudinal boundary line between two extending parts 178 disposed at two pixel PX1 and PX2) of two pixels PX1 and PX2. Accordingly, the shortest distance Wc between the left edge of the driving gate electrode 155a and the left side 78a and 78b of the extending part 178 in the pixel PX2 may be larger than the shortest distance Wd between the right edge of the driving gate electrode 155a and the right side 79a and 79b of the extending part 178.

Even if the misalignment in the first direction Dr1 is generated between the driving gate electrode 155a and the extending part 178, to obtain enough of a margin to maintain the capacitance of the capacitor Cst at a constant level, each of the shortest distances Wa, Wb, Wc, and Wd may be at least a predetermined distance, for example, about 1.5 micrometers, or about 2.85 micrometers. The shortest distances Wa and Wc are larger than the shortest distances Wb and Wd, and for example, may be about 4.25 micrometers or more. Each of the shortest distances Wa, Wb, Wc, and Wd is smaller than the width of the driving gate electrode 155a in the first direction Dr1, and may be smaller than a half of the width of the driving gate electrode 155a in the first direction Dr1.

According to an exemplary embodiment of the present invention, the pixel PX2 may be the pixel adjacent to the pixel PX1 in the first direction Dr1 or the second direction Dr2. For example, as shown in FIG. 3, when a pair of pixels PX1 and PX2 have the right/left symmetrical shape with respect to each other, each extending part 178 thereof is connected to the other, and they are adjacent to each other in the first direction Dr1 without the data line 171 or the driving voltage line 172 (directly adjacent), the extending part 178 and the driving gate electrode 155a included in the two pixels PX1 and PX2 may have the shape shown in FIG. 4 and FIG. 5. For example, the longitudinal center line CL2 of the recess portions 77a and 77b of each of the pixels PX1 and PX2 may be disposed to be biased to the side away from the longitudinal boundary line adjacent to two pixels PX1 and PX2. For example, the part corresponding to the relatively larger shortest distances Wa and Wc among the extending part 178 may be closer to the longitudinal boundary line between two pixels PX1 and PX2 than the part corresponding to the relatively smaller shortest distances Wb and Wd is.

However, the extending part 178 of the pixel PX2 might only have the right/left asymmetric shape and the extending part 178 of the pixel PX1 may have the substantially right/left symmetric shape.

A color represented by the pixel PX1 and the color represented by the pixel PX2 may be different from each other. For example, when the pixel PX1 displays red or blue, the pixel PX2 may display green.

The driving gate electrode 155a is connected to one terminal of the connecting member 174 through the contact hole 61, and the other terminal of the connecting member 174 is connected to the drain region of the third transistor T3 and the drain region of the fourth transistor T4 through the contact hole 63. The connecting member 174 may extend substantially in the second direction Dr2.

The active pattern 130 further includes a shielding part 135 overlapping the data line 171 and extending in parallel with the data line 171. The shielding pan 135, as a conductive region, may completely cover the width of the data line 171 in the first direction Dr1. As shown in FIG. 3, one skidding part 135 may overlap both of two adjacent data lines 171.

The shielding part 135 may be connected to the first longitudinal part 132 through a connection part 134. The connection part 134 as the conductive region of the active pattern 130 extends substantially in the first direction Dr1 and is connected to the driving voltage line 172 through the contact hole 65, thereby receiving the driving voltage ELVDD.

As described above, if the shielding part 135 having conductivity overlaps the data line 171, the data line 171 is shielded such that the parasitic capacitance between the data line 171 and the adjacent driving gate electrode 155a is shielded, and thereby the voltage of the driving gate electrode 155a being changed along the signal change of the data signal Dm such that the driving current. Id of the light emitting diode (LED) ED is changed may be prevented. For example, the crosstalk as the luminance change due to the parasitic capacitance between the data line 171 and the driving gate electrode 155a may be prevented.

Referring to FIG. 3, the shielding part 135 may include a recess portion 31 having a smaller width than the surroundings in the first direction Dr1. In the recess portion 31, the shielding part 135 might not overlap the data line 171.

The shielding part 135 may be omitted.

The shielding part 135 and the connection part 134 of the active pattern 130 might not overlap the signal line transmitting the signal in the first direction Dr1, for example, the plurality of scan lines 151, 152, and 152' and the plurality of control lines 153. The control line 153 is formed as the signal line adjacent to the shielding part 135 in the first direction Dr1, and the control line 153 may have a shape that does not overlap the shielding part 135 and the connection part 134. For example, the control line 153 may include a plurality of separated main line parts 53a and a plurality of detour parts 53b connecting two adjacent main line parts 53a.

Each main line part 53a extends substantially in the first direction Dr1, and passes two adjacent pixels PX disposed between two data lines 171 to be continuously extended. Accordingly, each main line part 53a may be disposed entirely between two data lines 171 adjacent to each other via two pixels PX1 and PX2, and might not overlap the data line 171. An end part of each main line part 53a is separated from the adjacent data line 171, and may be disposed between the channel region 131e of the fifth transistor T5 and the shielding part 135 or the data line 171. The main line part 53a includes a part overlapping the channel region 131e of the first longitudinal part 132 of the active pattern 130, and a part overlapping the channel region 131f of the second longitudinal pan 133 of the active pattern 130. An imaginary straight line IML of the main line part 53a may pass the shielding part 135, however it does not substantially overlap the shielding part 135.

The detour part 53b connects two main line parts 53a, that are adjacent to each other, via two adjacent data lines 171, to each other. One terminal of each detour part 53b may be connected to one transverse side of the main line part 53a at a connection position of an end of the main line part 53a. The channel region 131e may be disposed between the ends of the connection position JT and the main line part 53a. The detour part 53b, having a well shape, extends around the end of the first longitudinal pan 132 of the active pattern 130, the contact hole 65, and the connection part 134. As described above, the detour part 53b of the control line 153 detours under the active pattern 130 including the shielding part 135 and the connection part 134 to extend along a lower edge of the connection part 134, thereby not overlapping the active pattern 130 (particularly, the shielding part 135 and the connection part 134). Accordingly, the control line 153 does not overlap the active pattern 130 except for the channel region 131e of the fifth transistor T5 and the channel region 131f of the sixth transistor T6, and particularly does not overlap the shielding part 135 and the connection part 134.

However, the shape of the control line 153 is not limited thereto, and it may substantially and constantly extend in the first direction Dr1.

The display device, according to an exemplary embodiment of the present invention, may further include a third conductive layer including a plurality of pixel electrodes 191a and 191b and an initialization voltage line 192. The third conductive layer may be disposed on the second conductive layer, as may be seen in the cross-sectional view.

Each of the pixel electrodes 191a and 191b is electrically connected to the connecting member 179 of the corresponding pixels PX1 and PX2 through a contact hole 81, thereby receiving a voltage.

The plurality of pixel electrodes 191a and 191b may be arranged in a pentile matrix structure, as may be seen in the plan view, but the structure is not limited thereto. An area of the pixel electrode 191a connected to the sixth transistor T6 of the pixel PX1 may be larger than an area of the pixel electrode 191b connected to the sixth transistor T6 of the adjacent pixel PX2. For example, the pixel electrode 191a may be included in the pixel PX1 displaying reel or blue and the pixel electrode 191b may be included in the pixel PX2 displaying green.

Referring to FIG. 3, the pixel electrode 191b might not overlap the driving gate electrode 155a of the adjacent pixel, as may be seen in the plan view.

The pixel electrode 191a may overlap the driving gate electrode 155a of the adjacent pixel PX2 that is not the corresponding pixel PX1 Most of the overlapping area of the pixel electrode 191a of the pixel PX1 and the driving gate electrode 155a of the pixel PX2 may overlap the extending part 178 of the driving voltage line 172 disposed at the pixel PX2.

Referring to FIG. 3 and FIG. 5, the longitudinal center line CL2 of the recess portions 77a and 77b of the extending part 178 of the pixel PX2 overlapping the pixel electrode 491a of the pixel PX1 may be biased in the direction away from the pixel electrode 191a (in the first direction Dr1). For example, the shortest distances Wa and Wc between the longitudinal side of the driving gate electrode 155a of the adjacent pixel PX2 overlapping the pixel electrode 191a and the longitudinal side of the recess portions 77a and 77b of the extending part 178 may be larger than the shortest distances Wb and Wd between the longitudinal side of the driving gate electrode 155a of the opposite side and the longitudinal side of the recess portions 77a and 77b of the extending part 178.

The initialization voltage line 19.2 may be bent along an edge periphery of the adjacent pixel electrodes 191a and 191b and transmit an initialization voltage Vint. The initialization voltage line 192 is electrically connected to the connecting member 175 through a contact hole 82, thereby transmitting the initialization voltage Vint.

Next, an example of the cross-sectional structure of the display device according to an exemplary embodiment of the present invention will be described with reference to FIG. 6 to FIG. 8 along with the prior-described drawings.

The display device, according to an exemplary embodiment of the present invention, may include a substrate 110. The substrate 110 may include an inorganic insulating material such as glass or an organic insulating material such as a plastic of polyimide (PI), and may be flexible or bendable.

A buffer layer 120 may be disposed on the substrate 110. The buffer layer 120 blocks transfer of impurities from the substrate 110 to an upper layer for the buffer layer 120, and particularly to block the transfer of impurities to the semiconductor member 130. This may serve to preserve the characteristics of the semiconductor member 130 and reduce stress applied to the semiconductor member 130. The buffer layer 120 may include an inorganic insulating material such as a silicon nitride (SiNx) or a silicon oxide (SiOx), or an organic insulating material. Part or all of the buffer layer 120 may be omitted.

The above-described active pattern 130 is disposed on the buffer layer 120, and a gate insulating layer 140 is disposed on the semiconductor member 130.

A first conductive layer including the plurality of scan lines 151, 152, and 152', the control line 153, the driving gate electrode 155a, and the connecting member 154 that are described above may be disposed on the gate insulating layer 140. The first conductive layer may include a metal such as copper (Cu), aluminum (Al), molybdenum (Mo), or alloys thereof.

An interlayer insulating layer 160 is disposed on the first conductive layer and the gate insulating layer 140. The interlayer insulating layer 160 may include the inorganic insulating material such as the silicon nitride (SiNx) or the silicon oxide (SiOx), or the organic insulating material.

Figure 6:
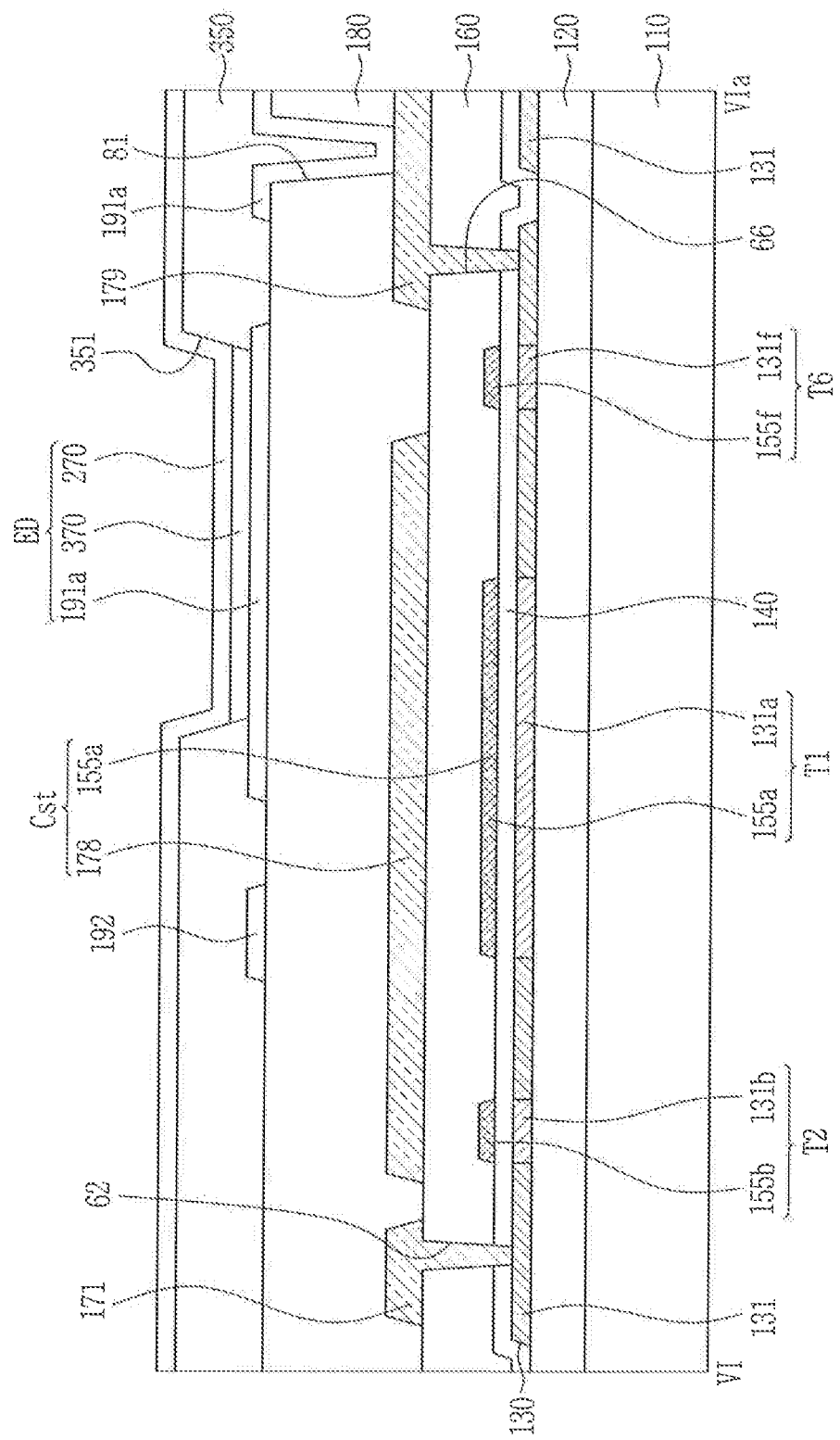
FIG. 6 is a cross-sectional view illustrating a display device shown in FIG. 3 taken along a line VI-VIa.
Figure 7:
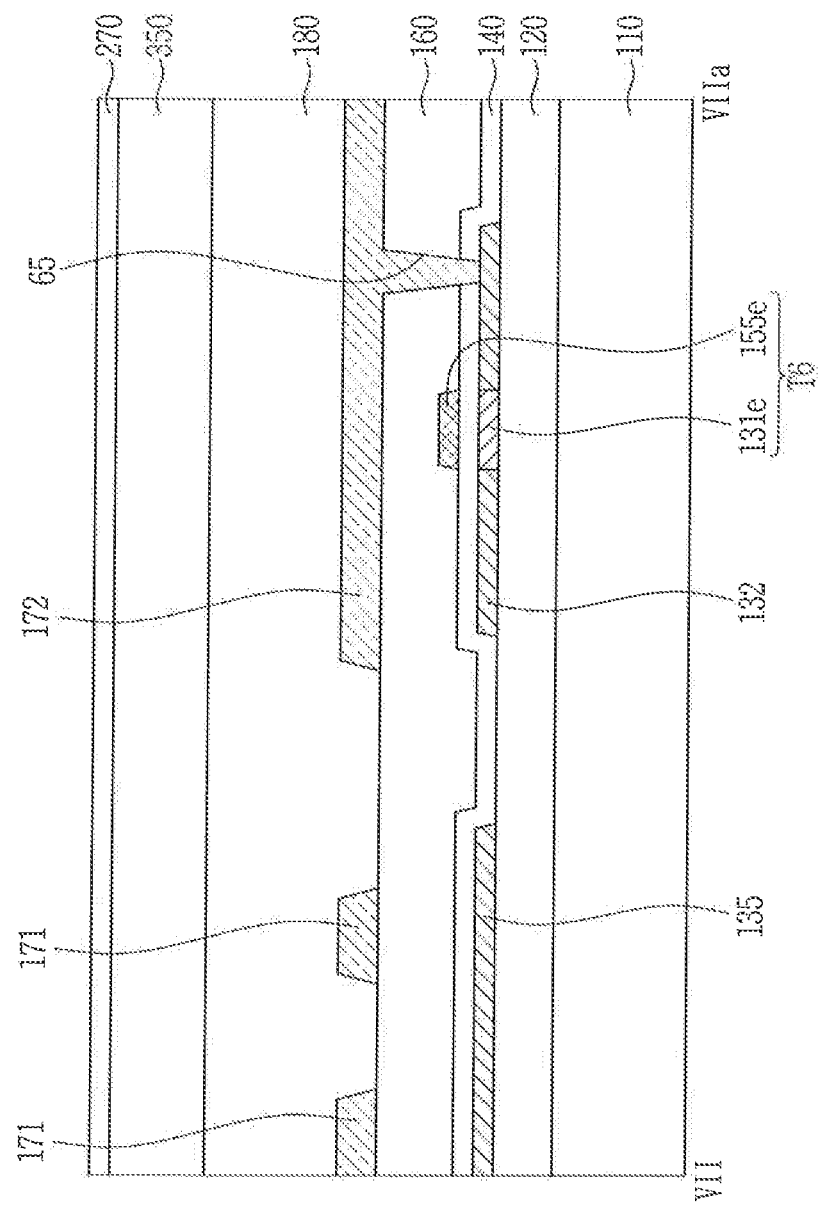
FIG. 7 is a cross-sectional view illustrating a display device shown in FIG. 3 taken along a line VII-VIIa.

Referring to DIG. 3, FIG. 6, and FIG. 7, the interlayer insulating layer 160 and/or the gate insulating layer 140 may include a contact hole 61 (see FIG. 10) disposed on the driving gate electrode 155a, a contact hole 62 disposed on the source region connected to the channel region 131b of the second transistor T2 among the conductive region of the active pattern 130, a contact hole 63 (see FIG. 10) disposed on the drain region connected to the channel region 131c of the third transistor T3 among the conductive region of the active pattern 130 or the drain region connected to the channel region 131d of the fourth transistor T4, a contact hole 64 (see FIG. 10) disposed on the source region connected to the channel region 131d of the fourth transistor T4 among the conductive region of the active pattern 130 or the drain region connected to the channel region 131g of the seventh transistor T7, a contact hole 65 disposed on the source region connected to the channel region 131e of the fifth transistor T5 among the conductive region of the active pattern 130, a contact hole 66 disposed on the drain region connected to the channel region 131f of the sixth transistor T6 among the conductive region of the active pattern 130, and a contact hole 68 (see FIG. 10) disposed on the connecting member 154.

A second conductive layer including the data line 171, the driving voltage line 172, and the connecting members 174, 175, and 179 is disposed on the interlayer insulating layer 160. The second conductive layer may include the metal such as copper (Cu), aluminum (Al), molybdenum (Mo) or alloys thereof.

Referring to FIG. 6, the data line 171 may be connected to the source region connected to the channel region 131b of the second transistor T2 through the contact hole 62 of the gate insulating layer 140 and the interlayer insulating layer 160.

The extension part 178 of the driving voltage line 172 overlaps the driving gate electrode 155a via the interlayer insulating layer 160, thereby forming the capacitor Cst.

The connecting member 179 may be connected to the drain region connected to the channel region 131f of the sixth transistor T6 through the contact hole 66.

A passivation layer 180 is disposed on the second conductive layer and the interlayer insulating layer 160. The passivation layer 180 may include an organic insulating material such as a polyacrylate resin and a polyimide resin, and an upper surface of the passivation layer 180 may be substantially flat. The passivation layer 180 may include a contact hole 81 disposed on the connecting member 179 and a contact hole 82 disposed on the connecting member 175.

A third conductive layer including the pixel electrode 191a and the initialization voltage line 192 may be disposed on the passivation layer 180. Referring to FIG. 6, the pixel electrode 191a may be connected to the connecting member 179 through the contact hole 81, and the initialization voltage line 192 may be connected to the connecting member 175 through the contact hole 82.

Figure 8:
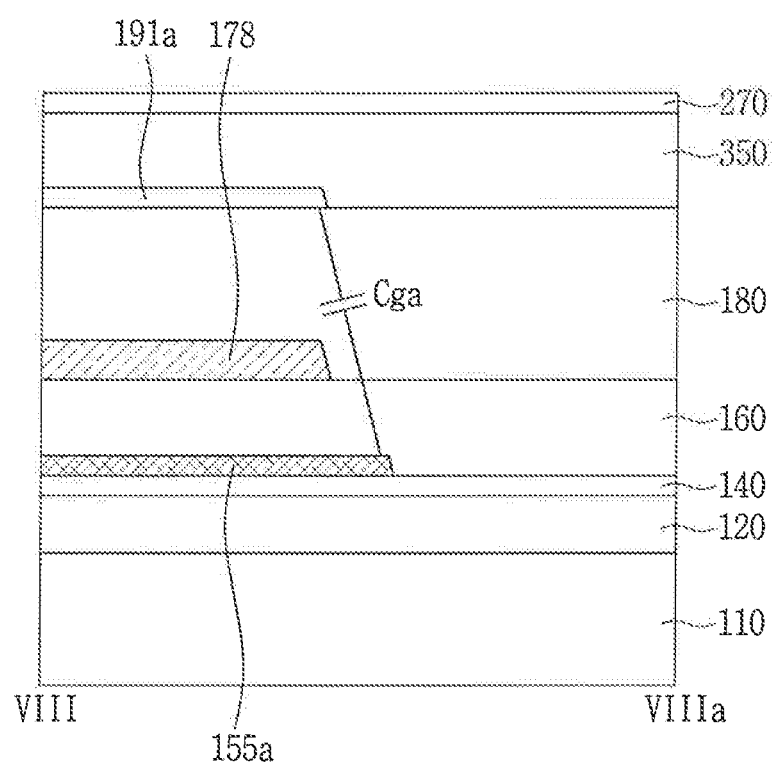
FIG. 8 is a cross-sectional view illustrating a display device shown in FIG. 3 taken along a line VIII-VIIIa and FIG. 9 and FIG. 10 are layout views illustrating adjacent pixels of a display device according to an exemplary embodiment of the present invention.

Referring to FIG. 3 and FIG. 8, a part of the edge portion of the pixel electrode 191a of one pixel PX1 overlaps the driving gate electrode 155a of the adjacent pixel PX2 via the interlayer insulating layer 160 and the passivation layer 180 interposed therebetween, thereby forming the capacitor (referred to as a fringe capacitor) Cga. The region overlapping the extending part 178 among the region where the pixel electrode 191a of the pixel PX1 and the driving gate electrode 155a of the pixel PX2 are overlapped with each other might not actually contribute to the area and the capacitance of the capacitor Cga since the extending part 178 as the conductor serves a shielding function for the coupling between the pixel electrode 191a and the driving gate electrode 155a.

The voltage of the driving gate electrode 155a of the pixel PX2 configuring one terminal of the capacitor Cga is affected by the voltage change amount of the pixel electrode 191a such that the pixel PX2 might not normally display a desired gray. Accordingly, as the area where the driving gate electrode 155a of the pixel PX2 and the pixel electrode 191a of the pixel PX1 directly overlap each other without the extending part 178 increases, the crosstalk between the pixel PX2 and the pixel PX1 may be more serious.

Therefore, according to an exemplary embodiment of the present invention, the longitudinal center line CL2 of the recess portions 77a and 77b of the extending part 178 of the pixel PX2 (See FIG. 5) are formed to be biased in the direction away from the pixel electrode 191a (in the first direction Dr1) of the adjacent pixel PX1 overlapping the extending part 178, so the area overlapping the extending part 178 among the overlapping region of the pixel electrode 191a and the driving gate electrode 155a of the pixel. PX2 may be maximized. Accordingly, in the pixel PX2, the left portion of the recess portion 77b of the extending part 178 may overlap the pixel electrode 191a as much as possible. Consequently, the area and the capacitance of the capacitor Cga formed by directly overlapping the pixel electrode 191a of the pixel PX1 and the driving gate electrode 155a of the pixel PX2 without the insertion of the extending part 178 may be minimized, and phenomenon by which crosstalk between the two pixels PX1 and PX2, which may prevent the display of the desired gray value in the pixels, may be minimized.

As shown in FIG. 3, the extending parts 178 of the driving voltage lines 172 disposed at both pixels PX1 and PX2 may be formed to be horizontally asymmetric, and the shape of the extending parts 178 of two adjacent pixels PX1 and PX2 may be formed to be symmetrical to each other. However, the extending part 178 of the pixel of which the driving gate electrode 155a does not overlap the pixel electrode of the other pixel may have the shape that is approximately horizontally symmetric.

The pixel electrode 191b does not overlap the driving gate electrode 155a of the other pixel, as may be seen in the plan view, such that the crosstalk between the pixels due to the voltage change of the pixel electrode 191b might not be generated.

A pixel defining layer (PDL) 350 may be disposed on the passivation layer 180, the initialization voltage line 192, and the pixel electrode 191a. The pixel defining layer 350 may include a glass insulating material and may have an opening 351 disposed on the pixel electrode 191a.

An emission layer 370 is disposed on the pixel electrode 191a. The emission layer 370 may be disposed in the opening 351. The emission layer 370 may include an organic emission material or an inorganic emission material.

A common electrode 270 is disposed on the emission layer 370. The common electrode 270 is also formed on the pixel defining layer 350, thereby extending throughout the plurality of pixels PX.

The pixel electrode 191a, the organic emission layer 370, and the common electrode 270 together form the light emitting diode (LED) ED.

An encapsulation layer protecting the organic light emitting diode ED may be disposed on the common electrode 270. The encapsulation layer may include an inorganic layer and an organic layer that are alternately deposited.

Figure 9:
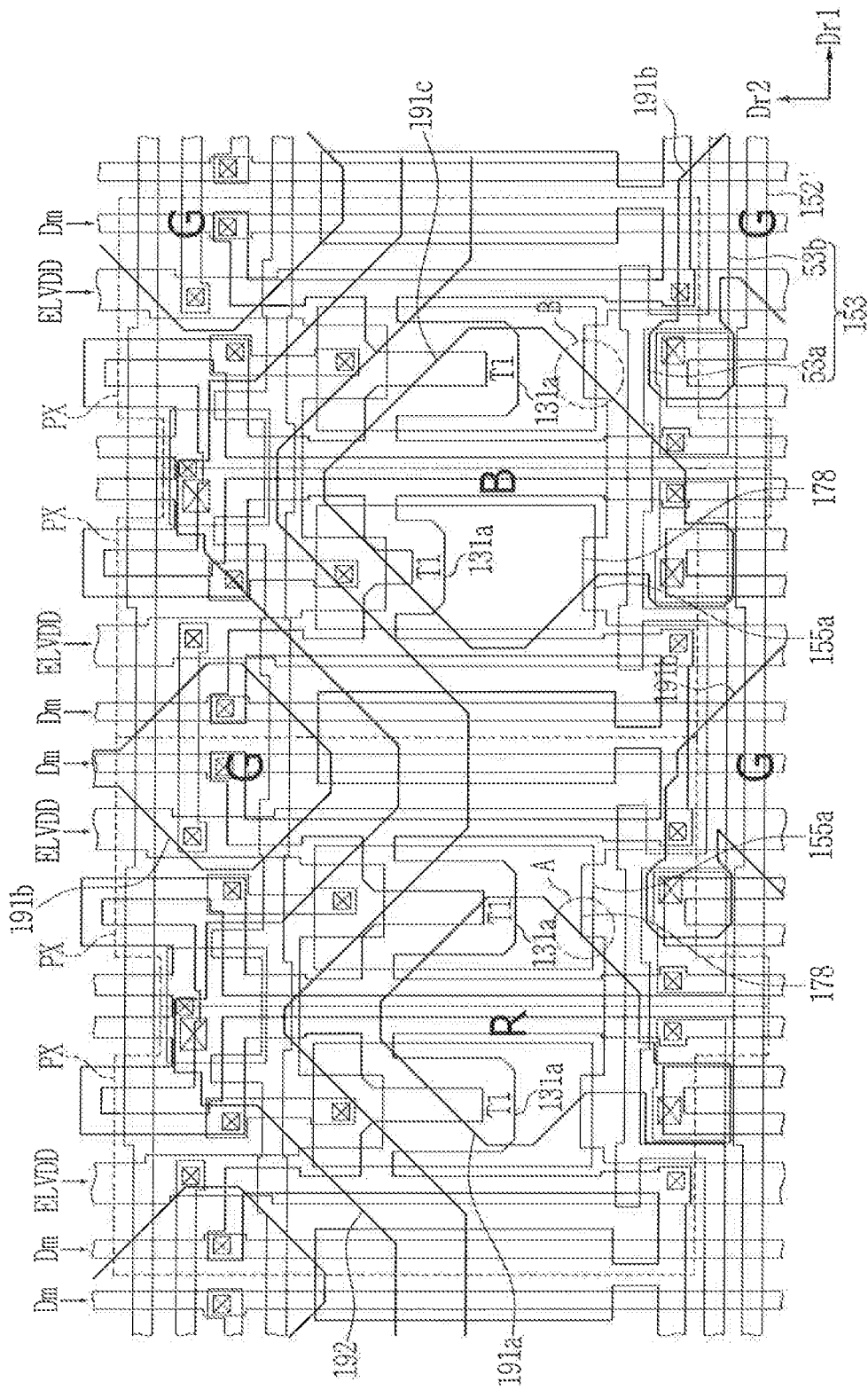

FIG. 9 is a layout view for adjacent pixels of a display device according to an exemplary embodiment of the present invention.

The display device, according to an exemplary embodiment of the present invention, shown in FIG. 9 is the same as most of the display device according to the arrangements shown in FIG. 3 to FIG. 8, however an arrangement of four adjacent pixels PX may be different.

The plurality of pixels PX included in the display device, according to an exemplary embodiment of the present invention, may respectively display a predetermined color, and for example, the pixels PX may include a red pixel R representing red, a green pixel G representing green, and a blue pixel B representing blue. FIG. 9 shows the red pixel R, the green pixel G, and the blue pixel B that are adjacent to each other. Alternatively, at least one among the red pixel R, the green pixel G, and the blue pixel B may represent different colors such as cyan, magenta, and yellow.

The pixel electrode 191*a* of the red pixel R may be smaller than the pixel electrode 191*c* of the blue pixel B, and the pixel electrode 191*b* of the green pixel G may be smaller than the pixel electrode 191*a* of the red pixel R. The pixel electrode 191*b* of the green pixel G might not overlap the driving gate electrode 155*a* of the other pixel PX, as may be seen in the plan view. Accordingly, the gray change of the adjacent pixel PX caused by the voltage change of the pixel electrode 191*b* of the green pixel G might not be noticeable.

The pixel electrode 191*a* of the red pixel R or the pixel electrode 191*c* of the blue pixel B may overlap the driving gate electrode 155*a* of the pixel PX directly adjacent thereto, as may be seen in the plan view, without the data line 171 or the driving voltage line 172. Most of the region where the pixel electrodes 191*a* and 191*c* overlap the driving gate electrode 155*a* of the directly adjacent green pixel G overlaps the extending part 178 of the driving voltage line 172 such that the generation of the capacitor Cga of a large capacitance may be prevented, however like the portion indicated by A and B in FIG. 9, the part of the edge portion of the pixel electrode 191*a* and 191*c* may overlap the driving gate electrode 155*a* of the adjacent green pixel G without the extending part 178 to form the capacitor Cga.

According to an exemplary embodiment of the present invention, as the right and left portions of the recess portions 77*a* and 77*b* of the extending part 178 of the driving voltage line 172 are formed to be asymmetric for the pixel including the driving gate electrode overlapping the pixel electrode of the other pixel or the entire pixel PX and the recess portion of the extending part 178 of the green pixel G is disposed to be biased to the side away from the red pixel R or the blue pixel B in the first direction Dr1, the left portion of the recess portion of the extending part 178 in the green pixel G may overlap the pixel electrode 191*a* of the red pixel R or the pixel electrode 191*c* of the blue pixel B to a greater extent. Accordingly, the area and the capacitance of the capacitor Cga formed by the overlapping of the pixel electrode 191*a* of the red pixel R or the pixel electrode 191*c* of the blue pixel B and the driving gate electrode 155*a* of the green pixel G without the insertion of the extending part 178 may be minimized. Therefore, the crosstalk may be reduced between the red pixel R and the green pixel G, or between the blue pixel B and the green pixel G, thereby preventing the gray of the green pixel G from being displayed differently from the desired gray.

Referring to FIG. 9, the length of the channel region 131*a* of the first transistor T1 included in the blue pixel B may be shorter than the length of the channel region 131*a* of the first transistor T1 of the other pixels R and G.

Figure 10:
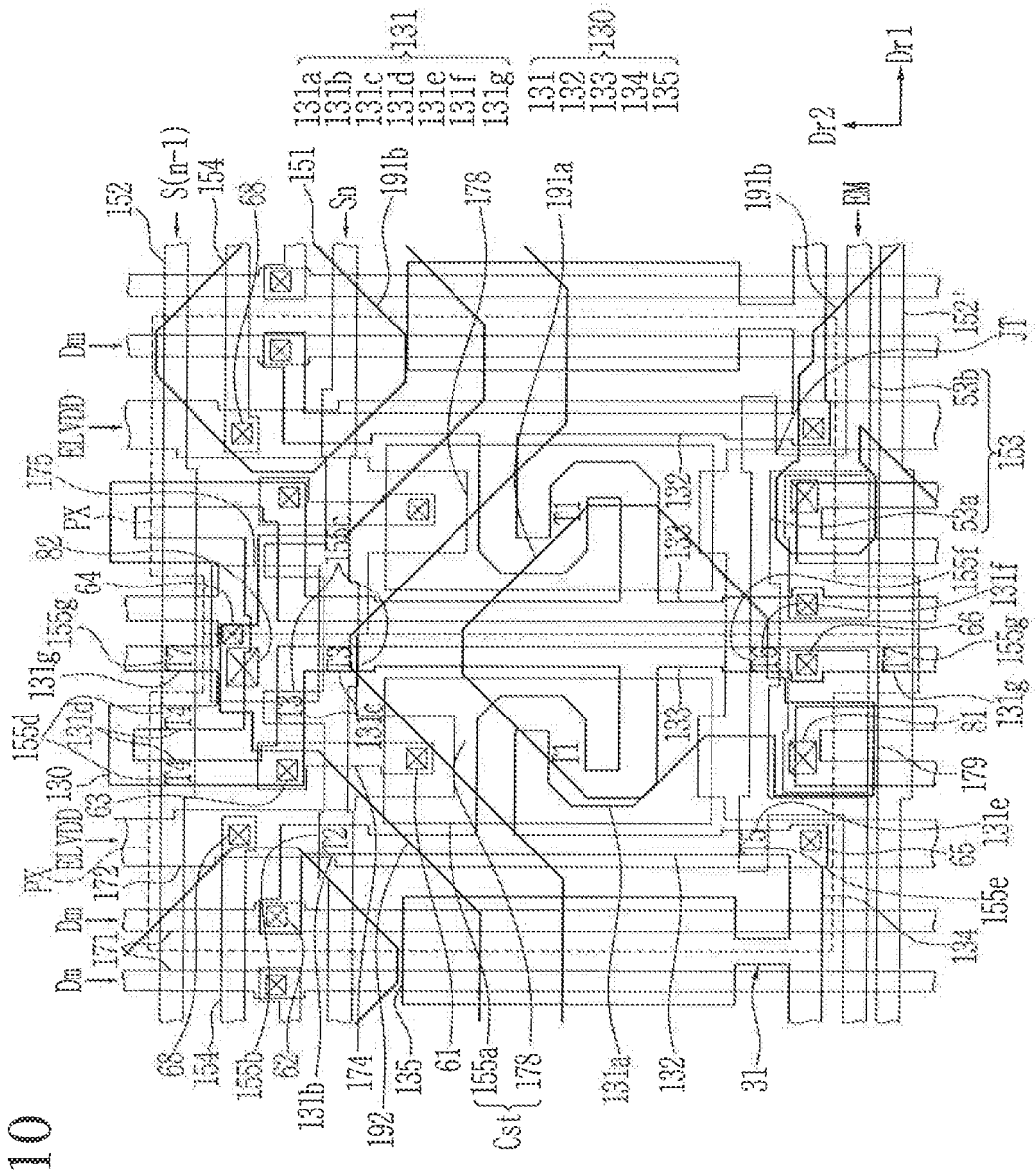

Next, the display device according to an exemplary embodiment of the present invention will be described with reference to FIG. 10 along with the above-described drawings. It may be assumed that elements not described with respect to this configuration may be similar to or identical to elements that were already described above.

The display device, according to an exemplary embodiment of the present invention, may have a different plane shape of the channel region 131*a* of the first transistor T1 as compared to the configurations described above. For example, the channel region 131*a* of the first transistor T1 may have an approximate "S" shape or a reversed "S" shape.

It is to be understood that the other features and characteristics of this configuration may be substantially similar to or identical to those corresponding features and characteristics of the other figures that are described above.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device, comprising:
a plurality of pixels including a first pixel and a second pixel;
a plurality of scan lines extending in a first direction;
a plurality of data lines crossing the plurality of scan lines, the plurality of data lines transmitting a data signal;
a plurality of driving voltage lines crossing the plurality of scan line, and the plurality of driving voltage lines transmitting a driving voltage;
a first driving gate electrode disposed at the first pixel; and
a second driving gate electrode disposed at the second pixel,
wherein a first driving voltage line among the plurality of driving voltage lines incudes a first extending part that overlaps the first driving gate electrode,
wherein a second driving voltage line among the plurality of driving voltage lines includes a second extending part that overlaps the second driving gate electrode,
wherein a first pixel electrode of the first pixel overlaps the second driving gate electrode,
wherein the second extending part includes a first recess portion,
wherein a center line of the first recess portion is offset in a direction away from the first pixel electrode with respect to a center line of the second driving gate electrode,
wherein a first shortest distance between a first side of the first recess portion and a second side of the second driving gate electrode is larger than a second shortest distance between a third side of the first recess portion facing the first side and a fourth side of the second driving gate electrode facing the second side,
wherein the first side, the second side, the third side, and the fourth side are each extended substantially in a second direction perpendicular to the first direction, and
wherein the first side is closer to the first pixel than the third side is.

2. The display device of claim 1, wherein the center line of the first recess portion is spaced away from the first pixel electrode in the first direction.

3. The Display device of claim 1, wherein a region were the first pixel electrode and the second driving gate electrode are overlapped also overlaps the second extending part.

4. The display device of claim 3, wherein the second extending part is disposed between the first pixel electrode and the second driving gate electrode.

5. The display device of claim 1, wherein the second shortest distance is at least about 2.85 micrometers.

6. The display device of claim 1, wherein the first extending part has a shape that is symmetrical with respect to the second extending part.

7. The display device of claim 1, wherein:
the first pixel emits light of blue or red; and
the second pixel emits light of green.

8. The display device of claim 1, wherein:
the first pixel and the second pixel are adjacent to each other in the first direction;
the first pixel and the second pixel are disposed at a region between two adjacent data lines among the plurality of data lines; and
the first extending part and the second extending part are connected to each other.

9. The display device of claim 1, wherein;
the second extending part further includes a second recess portion disposed at a second edge facing the first edge; and
the first recess portion and the second recess portion are symmetrically shaped with respect to each other about a center line extending in the first direction of the second extending part.

10. A display device, comprising:
a plurality of data lines;
a plurality of driving voltage lines;
a first pixel; and
a second pixel,
wherein each of the first and second pixels includes:
a light emitting diode;
a sixth transistor connected to the light emitting diode;
a first transistor connected to the sixth transistor, the first transistor including a driving gate electrode; and
an extending part extending from the driving voltage line and overlapping the driving gate electrode to form a capacitor,
wherein the extending part of the first pixel has an asymmetric shape with respect to a line extending in the first direction,
wherein the extending part of the second pixel has a shape that is symmetrical with respect to the extending part of the first pixel about a line extending in the first direction,
wherein the extending part includes a first recess portion,
wherein a first shortest distance between a first side of the first recess portion and a second side of the second driving gate electrode is larger than a second shortest distance between a third side of the first recess portion facing the first side and a fourth side of the second driving gate electrode facing the second side in the second pixel,
wherein the first side, the second side, the third side, and the fourth side are extended substantially in a first direction, and
wherein the first side is closer to the first pixel than the third side is.

11. The display device of claim 10, wherein;
the light emitting diode includes a pixel electrode; and
the pixel electrode of the first pixel overlaps the driving gate electrode of the second pixel.

12. The display device of claim 10, wherein the second shortest distance is at least about 2.85 micrometers.

13. The display device of claim 10, wherein:
the extending part further includes a second recess portion; and
the first recess portion and the second recess portion are symmetrical with respect to each other about a center line of the extending part that extends in a second direction perpendicular to the first direction.

14. The display device of claim 13, wherein
in the second pixel, a center line extended in the first direction of the first and second recess portions is offset in a direction away from the first pixel with respect to a center line of the driving gate electrode extending in the first direction.

15. The display device of claim 11, wherein a region where the pixel electrode of the first pixel and the driving gate electrode of the second pixel are overlapped further overlaps the extending part of the second pixel.

16. The display device of claim 15, wherein the extending part of the second pixel is disposed between the pixel electrode of the first pixel and the driving gate electrode of the second pixel.

17. The display device of claim 11, wherein;
the first pixel and the second pixel are adjacent to each other in a second direction perpendicular to the first direction;
the first pixel and the second pixel are disposed at a region between two adjacent date lines among the plurality of data lines; and
the extending part of the first pixel and the extending part of the second pixel are connected to each other.

18. The display device of claim 11, wherein;
the first pixel emits light of blue or red; and
the second pixel emits light of green.

* * * * *